(12) United States Patent
Tung et al.

(10) Patent No.: US 10,944,202 B1
(45) Date of Patent: Mar. 9, 2021

(54) ADAPTER MODULE

(71) Applicants:Inventec (Pudong) Technology Corp., Shanghai (CN); Inventec Corporation, Taipei (TW)

(72) Inventors: Kai-Yang Tung, Taipei (TW); Hung-Ju Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 16/572,640

(22) Filed: Sep. 17, 2019

(30) Foreign Application Priority Data

Sep. 6, 2019 (CN) .......................... 201910843995.0

(51) Int. Cl.
*H01R 13/52* (2006.01)
*H01R 31/06* (2006.01)
*H01R 13/74* (2006.01)
*H05K 7/20* (2006.01)
*H05K 1/18* (2006.01)

(52) U.S. Cl.
CPC ....... *H01R 13/5202* (2013.01); *H01R 13/748* (2013.01); *H01R 31/06* (2013.01); *H05K 1/181* (2013.01); *H05K 7/203* (2013.01); *H05K 2201/10189* (2013.01); *H05K 2201/10545* (2013.01)

(58) Field of Classification Search
CPC .. H01R 31/06; H01R 13/5202; H01R 13/748; H05K 1/181; H05K 7/203
See application file for complete search history.

(56) References Cited

U.S. PATENT DOCUMENTS

| | | | | |
|---|---|---|---|---|
| 6,407,925 B1 * | 6/2002 | Kobayashi | ........... | H05K 5/0052 200/61.88 |
| 7,184,273 B2 * | 2/2007 | Sakai | ................... | H05K 5/0039 361/728 |
| 7,611,371 B2 * | 11/2009 | Guo | ...................... | H01R 13/447 439/367 |
| 8,526,182 B2 * | 9/2013 | Chen | .................. | H05K 7/20736 361/696 |
| 8,926,345 B2 * | 1/2015 | Kim | ................... | G06K 13/0825 439/142 |
| 9,688,228 B2 * | 6/2017 | Azuma | ................ | H05K 5/0204 |

(Continued)

*Primary Examiner* — Abdullah A Riyami
*Assistant Examiner* — Nader J Alhawamdeh
(74) *Attorney, Agent, or Firm* — Winston Hsu

(57) ABSTRACT

A container for immersion cooling system includes a plural of container sidewalls, a circuit board, an inner connector, and an outer connector. The plural of container sidewalls form an accommodating space. One of the plural of container sidewalls has an opening. The circuit board is fixed to the one of the plural of container sidewalls and seals the opening. The circuit board has a first surface and a second surface opposite to the first surface. The first surface is exposed to the accommodating space. The inner connector is fixed on the first surface and is located in the accommodating space. The outer connector is fixed on the second surface and is electrically connected to the inner connector through the circuit board. The outer connector is exposed out of the container. Therein, the circuit board, the inner connector, and the outer connector form an adapter module for the container.

6 Claims, 8 Drawing Sheets

(56) References Cited

U.S. PATENT DOCUMENTS

| | | | |
|---|---|---|---|
| 2008/0184775 A1* | 8/2008 | Yamagishi | G01N 27/185 73/25.05 |
| 2010/0294021 A1* | 11/2010 | Makino | G01N 25/18 73/25.03 |
| 2012/0264313 A1* | 10/2012 | Zhang | H01R 13/52 439/131 |
| 2018/0177067 A1* | 6/2018 | Manushi | H05K 5/03 |
| 2018/0279508 A1* | 9/2018 | Roan | H05K 7/20254 |
| 2019/0353506 A1* | 11/2019 | Yoda | G01D 11/245 |

* cited by examiner

ADAPTER MODULE

BACKGROUND OF THE INVENTION

1. Field of the Invention

The present invention relates to an immersion cooling system, and more particularly to a container used in an immersion cooling system and an adapter module installed on the container.

2. Description of the Prior Art

In equipment with a two-phase immersion cooling system, electronic components or devices thereof are immersed in a dielectric liquid. Heat generated by the electronic components or devices is dissipated through a phase transition of the dielectric liquid from a liquid state to a gas state. However, the electronic components or devices still need to execute signal communication through networks with other electronic devices or the like, so the container of the two-phase immersion cooling system usually has holes. The electronic components or devices then can be connected with external devices through common connectors installed on the holes for transmitting power and signals. The gas of the dielectric liquid also probably leaks out through the holes, gaps or the like on the container, resulting in reduction of the dielectric liquid. Although a reduction in quantity of the holes and a higher location of the holes are helpful to the leakage of the dielectric liquid, there must be a hole on a side wall of a container with a server installed therein, so that the server can be connected with external devices for power and signals. Because just passing a cable through the hole can effectively perform sealing, and common connectors for power and signals usually lack for airtight effect, it is difficult to effectively prevent the gas of the dielectric liquid from leaking out. Furthermore, taller containers will induce some difficulty in maintenance. Therefore, it is quite important for the design of two-phase immersion cooling systems to reduce the leakage of the dielectric liquid or the gas thereof from the holes or input/output connectors thereof.

SUMMARY OF THE INVENTION

An objective of the invention is to provide a container for an immersion cooling system. The container provides a connection interface for power and signals between the inside and outside of the container. The connection interface is so airtight as to eliminate or reduce the leakage of the dielectric liquid or the gas thereof in the container from the connection interface.

A container according to the invention is used in an immersion cooling system. The container includes a plurality of container sidewalls, a circuit board, an inner connector, and an outer connector. The container sidewalls form an accommodating space. One of the container sidewalls has an opening. The circuit board is fixed to the container sidewall and seals the opening. The circuit board has a first surface and a second surface opposite to the first surface. The first surface is exposed to the accommodating space. The inner connector is fixed on the first surface and is located in the accommodating space. The outer connector is fixed on the second surface and is electrically connected to the inner connector through the circuit board. The outer connector is exposed out of the container.

An objective of the invention is to provide an adapter module that is disposed on a container sidewall of a container for an immersion cooling system. The adapter module provides a connection interface for power and signals between the inside and outside of the container. The connection interface is so airtight as to eliminate or reduce the leakage of the dielectric liquid or the gas thereof in the container from the connection interface.

An adapter module according to the invention is disposed on a container sidewall of a container for an immersion cooling system. The container sidewall has an opening. The adapter module includes a circuit board, an inner connector, and an outer connector. The circuit board has a first surface and a second surface opposite to the first surface. The inner connector is fixed on the first surface. The outer connector is fixed on the second surface and is electrically connected to the inner connector through the circuit board. Therein, the adapter module is fixed to the container sidewall and seals the opening through the circuit board, so that the inner connector is located in an accommodating space of the container and the outer connector is exposed out of the container.

Compared with the prior art, in the container and the adapter module according to the invention, the circuit board can seal the opening and the electrical connection between the inner connector, and the outer connector will not produce structural through holes on the circuit board to damage or reduce the sealing effect, so the sealing to the opening of the container sidewall can be maintained so as to eliminate or reduce the leakage of the dielectric liquid or the gas thereof in the container from the connection interface.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
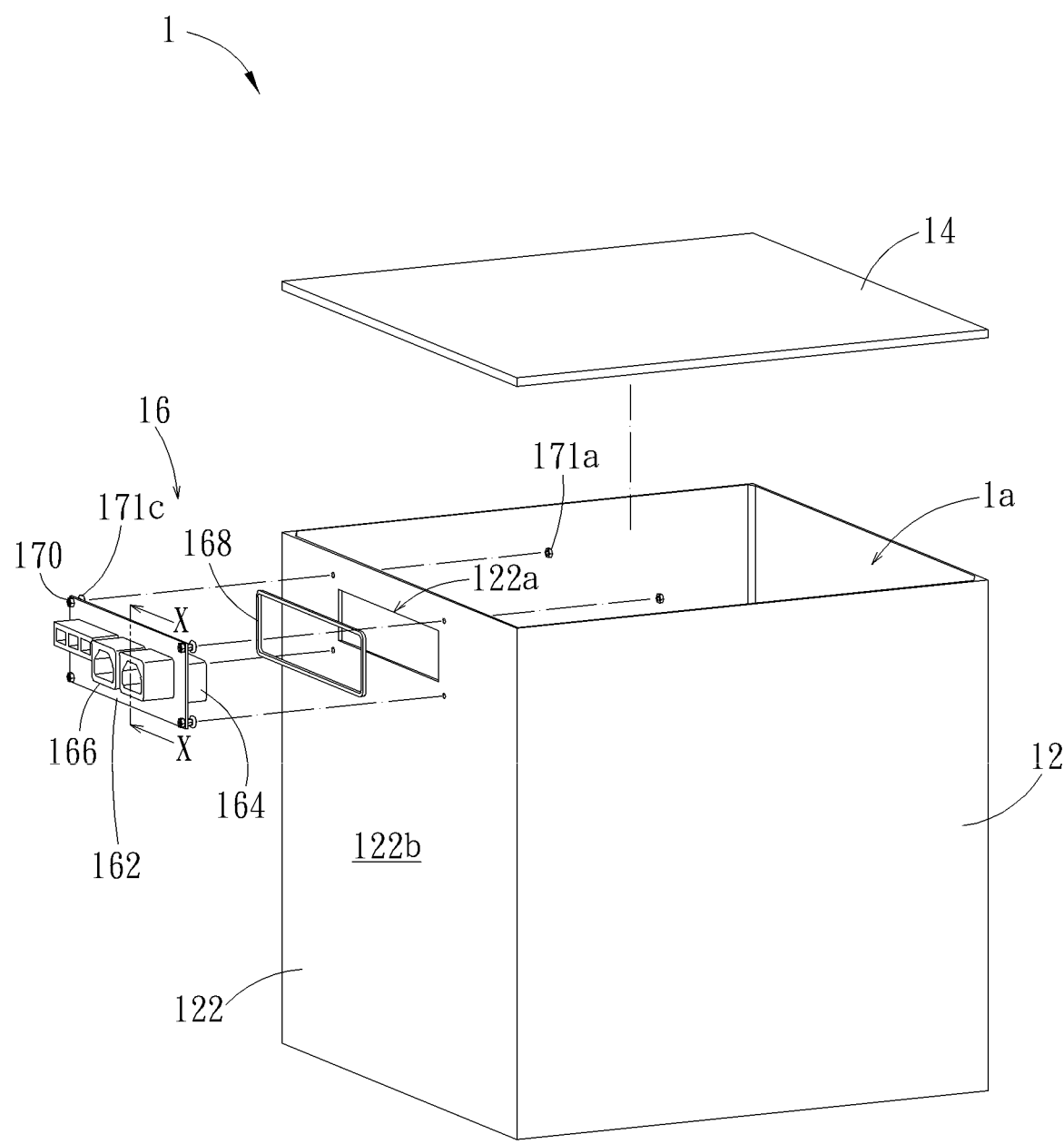
FIG. 1 is an exploded view of a container according to an embodiment.
Figure 2:
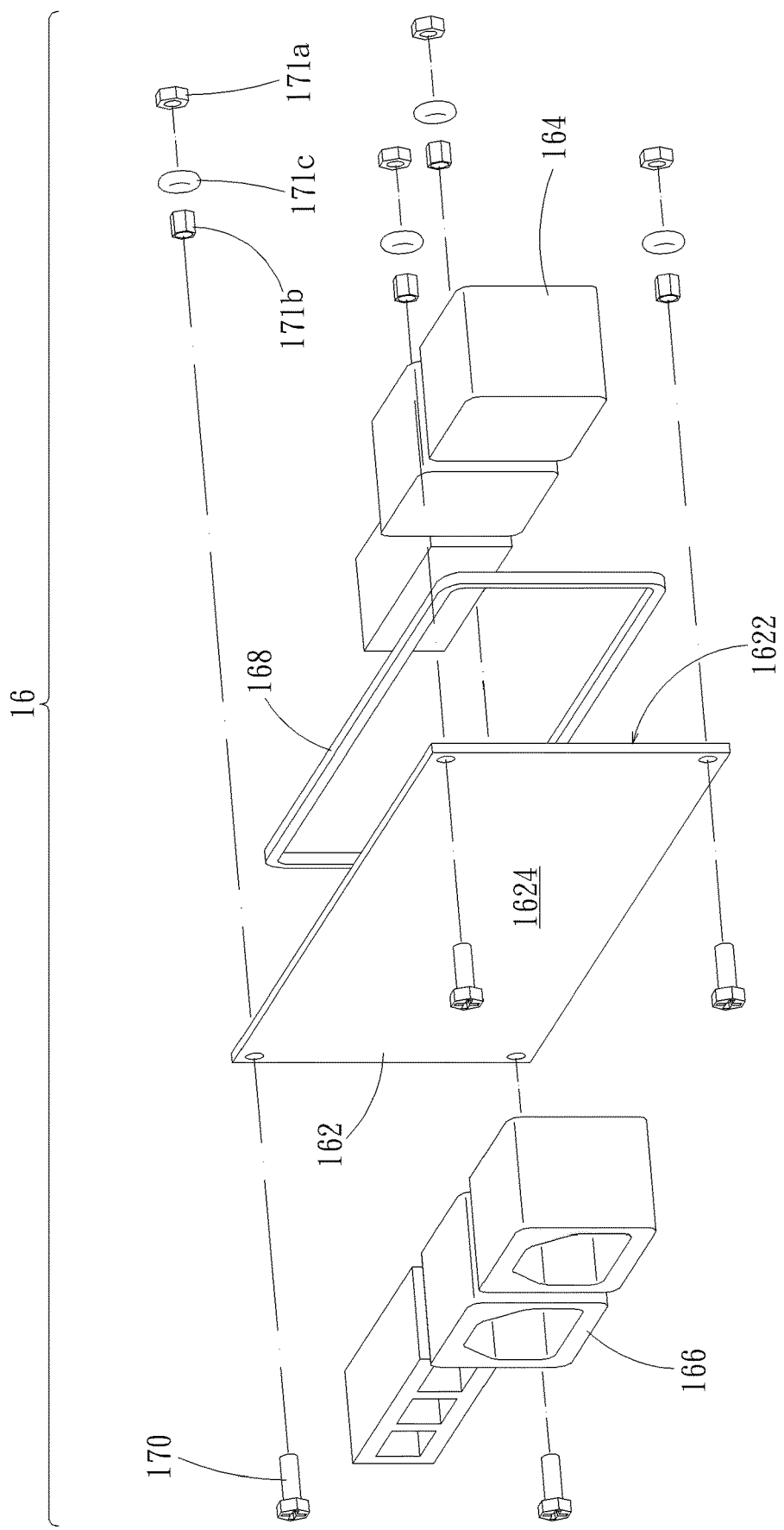
FIG. 2 is an exploded view of an adapter module in FIG. 1.
Figure 3:
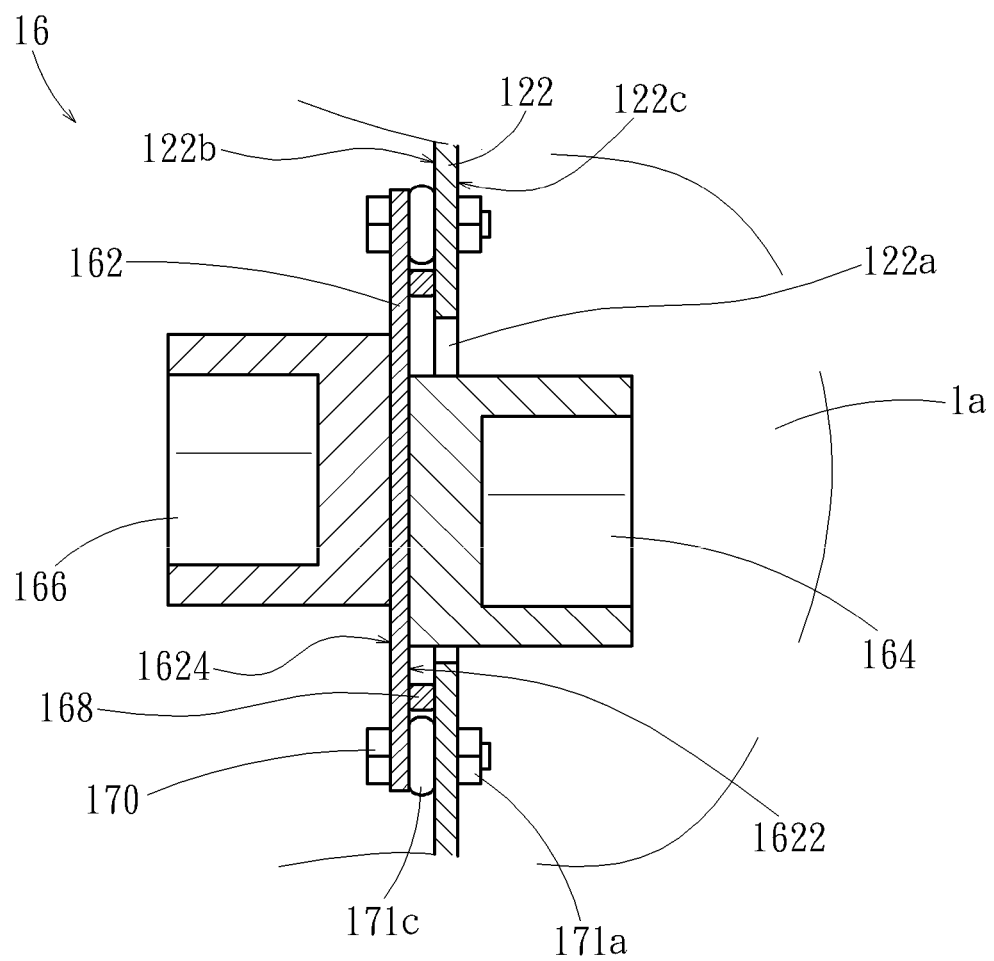
FIG. 3 is a sectional view of a portion of the container along the line X-X in FIG. 1.

Please refer to FIG. 1 to FIG. 3. A container 1 according to an embodiment includes a main body 12, an upper cover 14, and an adapter module 16. The upper cover 14 and the main body 12 join together to form an accommodating space 1a capable of accommodating an electronic system (e.g. a system mainboard), cooling liquid, a condenser and so on. The main body 12 includes a plurality of container sidewalls. One container sidewall 122 of the container sidewalls has an opening 122a. The adapter module 16 is installed to the container sidewall 122 and seals the opening 122a. The electronic system accommodated in the accommodating space 1a can be electrically connected with external devices (such as input/output devices, displaying devices, power sources and so on) through the adapter module 16. In practice, the adapter module 16 also can be installed to other container sidewall of the container 1 (e.g. a container sidewall of the upper cover 14), which will not be described in addition. Furthermore, in practice, an O-ring can be used between the upper cover 14 and the main body 12 for enhancing the sealing effect. The connection between the connection pipes, which connect the condenser with an external device (e.g. a heat-dissipating device), and the container sidewalls also is sealed (by filling the gaps between the pipes and the container sidewalls with sealing material, using sealing adapters and so on). Thereby, the container 1 can provide an effective sealing to the accommodating space 1a, so that the container 1 is suitable for immersion cooling systems. The container 1 can avoid or reduce the leakage of the dielectric liquid accommodated in the accommodating space 1a out of the container 1, and can provide an interface for connecting the electronic system accommodated in the accommodating space 1a with the external devices.

In the embodiment, the electronic system such as a main board of a server includes a central processing unit, a baseboard management controller, memory, a hard disk, a power supply, peripheral component interconnect express (abbreviated as PCIe), and basic input/output system (abbreviated as BIOS) thereon.

In the embodiment, the adapter module 16 includes a circuit board 162, a plurality of inner connectors 164, and a plurality of outer connectors 166. The circuit board 162 has a first surface 1622 and a second surface 1624 opposite to the first surface 1622. The inner connectors 164 are fixed on the first surface 1622. The outer connectors 166 are fixed on the second surface 1624. The circuit board 162 is fixed to the container sidewall 122 and seals the opening 122a. The first surface 1622 is exposed to the accommodating space 1a. The inner connectors 164 are located in the accommodating space 1a. The outer connectors 166 are exposed to the outside of the container 1. Furthermore, the inner connectors 164 and the outer connectors 166 are not connected directly but electrically connected through the circuit board 162. In practice, the inner connectors 164 are not limited to correspond to the outer connectors 166 one by one in structure; for example, some inner connectors 164 or some outer connectors 166 can be structurally integrated into a single connector.

Furthermore, in the embodiment, the first surface 1622 is opposite to an outer wall surface 122b of the container sidewall 122. The adapter module 16 further includes a sealing ring 168 for enhancing the sealing of the circuit board 162 with the container sidewall 122 (or the opening 122a thereof). Therein, the sealing ring 168 encloses the opening 122a of the container sidewall 122 and also the inner connectors 164, and is clamped by and between the first surface 1622 and the outer wall surface 122b. Furthermore, the adapter module 16 further includes a plurality of fixing parts 170, for fixing the circuit board 162 to the container sidewall 122. In the embodiment, the fixing parts 170 are located at the outside of the sealing ring 168. The fixing part 170 is a screw in coordination with a nut 171a and a spacer ring 171b so as to screw the circuit board 162 on the container sidewall 122, which can be in coordination with an O-ring 171c for enhancing the sealing herein. Furthermore, in practice, it is practicable to use other additional components for enhancing the sealing herein; for example, a sealing washer is disposed between the screw head and the circuit board 162, and another one is between the nut 171a and an inner wall surface 122c and the container sidewall 122. However, it is not limited thereto in practice. For an example, a stud is fixed on the container sidewall 122 (e.g. by a rivet joint), the fixing part 170 is replaced with a nut 171a, and the circuit board 162 is fixed to the container sidewall 122 by screwing the nut 171a onto the stud. The above fixing structure using the stud can be regarded in structure as the container sidewall 122 herein without through holes, which will not require sealing. For another example, a rod with a threaded hole is directly fixed on the outer wall surface 122b of the container sidewall 122, and the fixing part 170 can be directly screwed into the rod with the threaded hole. It also can fix the circuit board 162 to the container sidewall 122. Besides, the container sidewall 122 herein does not require through holes and has no need of sealing.

Furthermore, in the embodiment, the inner connector 164 is fixed on the first surface 1622 by a surface mount technology (abbreviated as SMT). The outer connector 166 is fixed on the second surface 1624 by a surface mount technology. In practice, the circuit board 162 can be realized by a multi-layer board. The circuitry on each layer can be connected through a plurality of vias so as to prevent the circuit board 162 from forming through holes passing through the circuit board 162 to affect the sealing. In practice, even if the circuitry of the circuit board 162 is connected through some through holes, the through holes still can be filled up with proper material (e.g. solder) for maintaining the sealing of the circuit board 162 to the opening 122a. Similarly, even if the inner connector 164 and the outer connector 166 are fixed on the circuit board 162 by a through-hole technology respectively, the through holes on the circuit board 162 for inserting the above component can be filled up with solder, so as to maintain the sealing of the circuit board 162 to the opening 122a. In addition, the circuit board 162 also can have a conformal coating that is formed on the first surface 1622. The conformal coating can enhance the weathering resistance of the circuit board 162 and can fill up voids probably produced in the manufacture, which enhances the sealing further.

Figure 4:
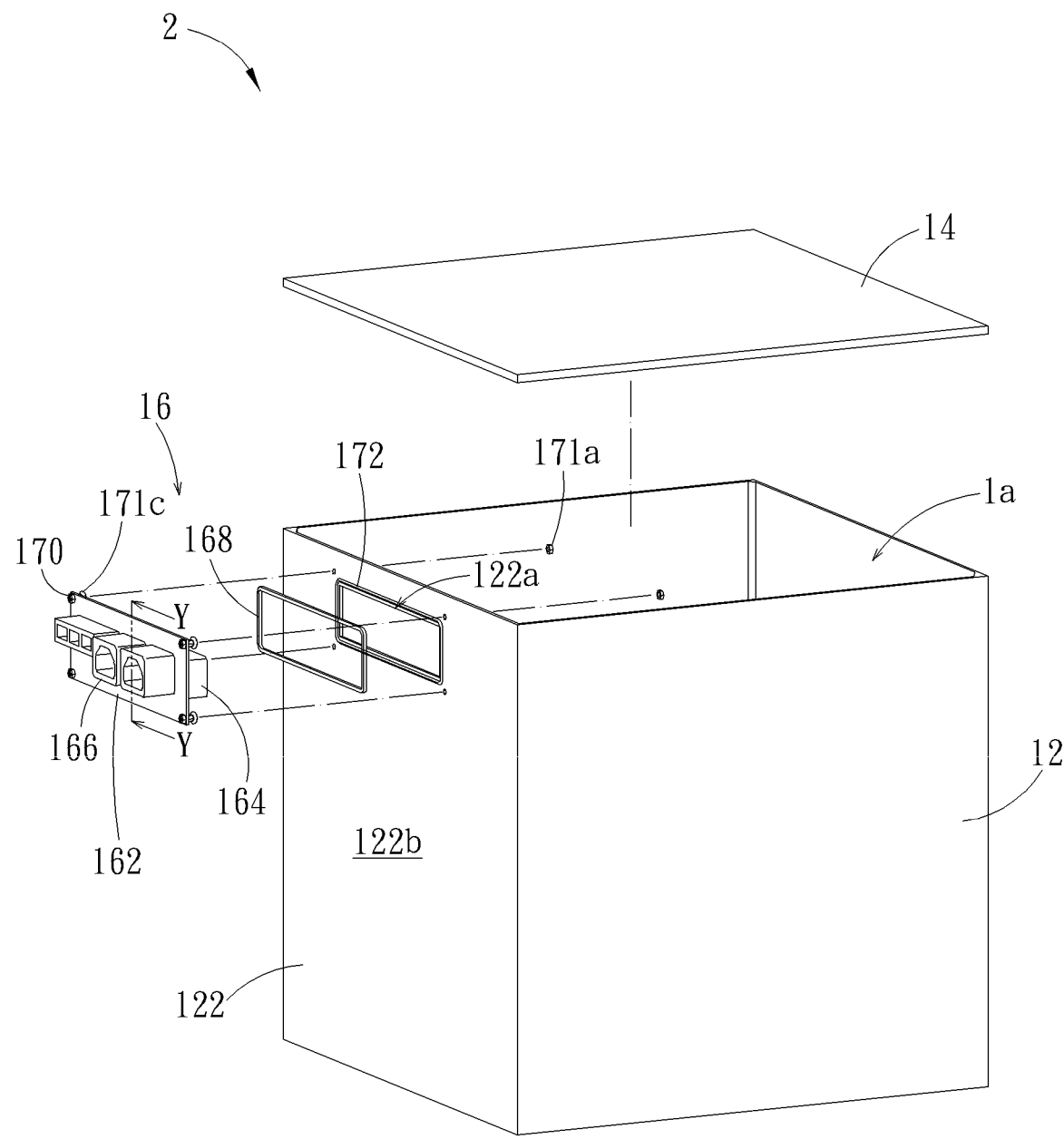
FIG. 4 is an exploded view of a container according to another embodiment.
Figure 5:
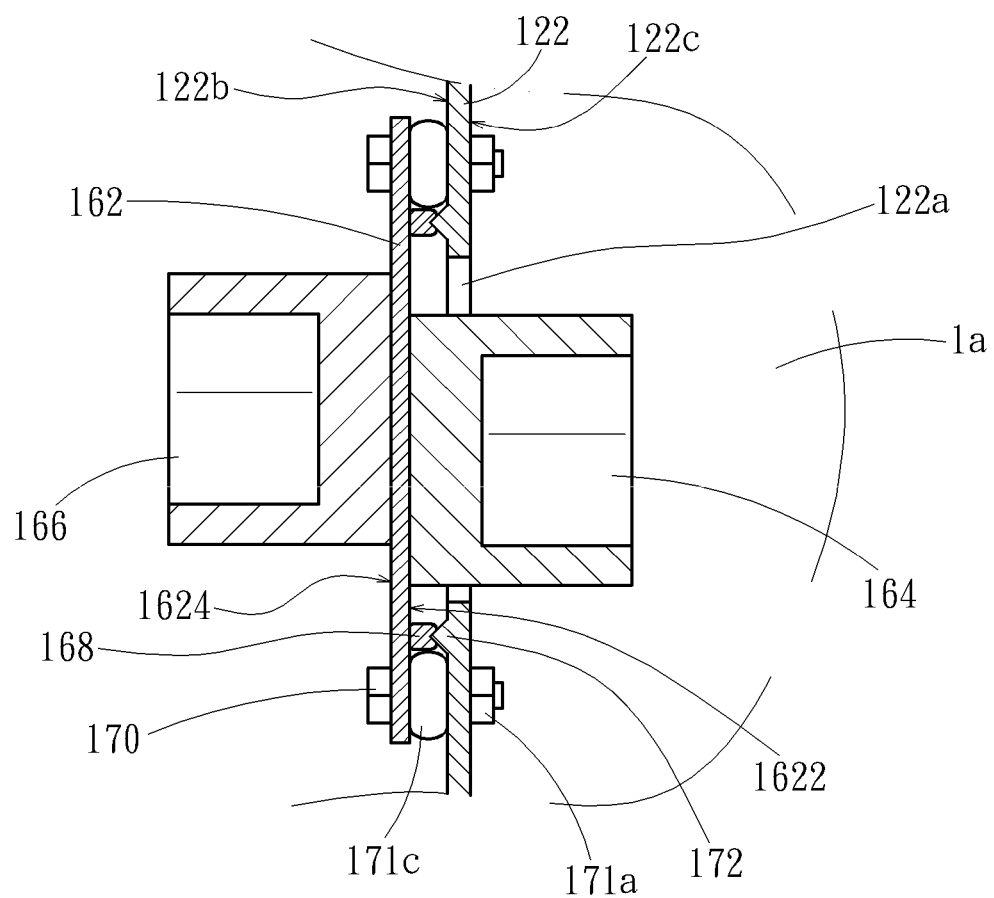
FIG. 5 is a sectional view of a portion of the container along the line Y-Y in FIG. 4.

In addition, in practice, the container 1 can also include other structures for enhancing the sealing effect of the sealing ring 168. Please refer to FIG. 4 and FIG. 5, which show a container 2 according to another embodiment. The container 2 is substantially similar in structure to the container 1, and uses the reference numbers of the container 1 in principle. For other descriptions about the container 2, please refer to the descriptions of the container 1 and the variants thereof in the foregoing, which will not be described in addition. Compared with the container 1, the adapter module 26 of the container 2 further includes an annular protrusion 172 disposed on the outer wall surface 122b of the container sidewall 122 corresponding to the sealing ring 168. The profiles of the annular protrusion 172 and the sealing ring 168 are the same. The annular protrusion 172 abuts against the sealing ring 168, so as to enhance the sealing of the circuit board 162 to the opening 122a. In the embodiment, the annular protrusion 172 and the container sidewall 122 are formed in a single part (e.g. the container sidewall 122 is made of thermal plastic material); however, it is not limited thereto in practice. For example, the annular protrusion 172 is formed by another part adhering to the outer wall surface 122b. The sectional profile of the annular protrusion 172 is a triangle, so the annular protrusion 172 has an edge that can be pressed in the sealing ring 168, which can increase the area of the annular protrusion 172 contacting the sealing ring 168 and enhance the stability of the contact. Both can enhance the sealing of the circuit board 162 to the opening 122a. In addition, in practice, it is practicable to dispose the annular protrusion 172 on the first surface 1622 of the circuit board 162, which also can enhance the sealing of the circuit board 162 to the opening 122a and will not be described in addition.

Figure 6:
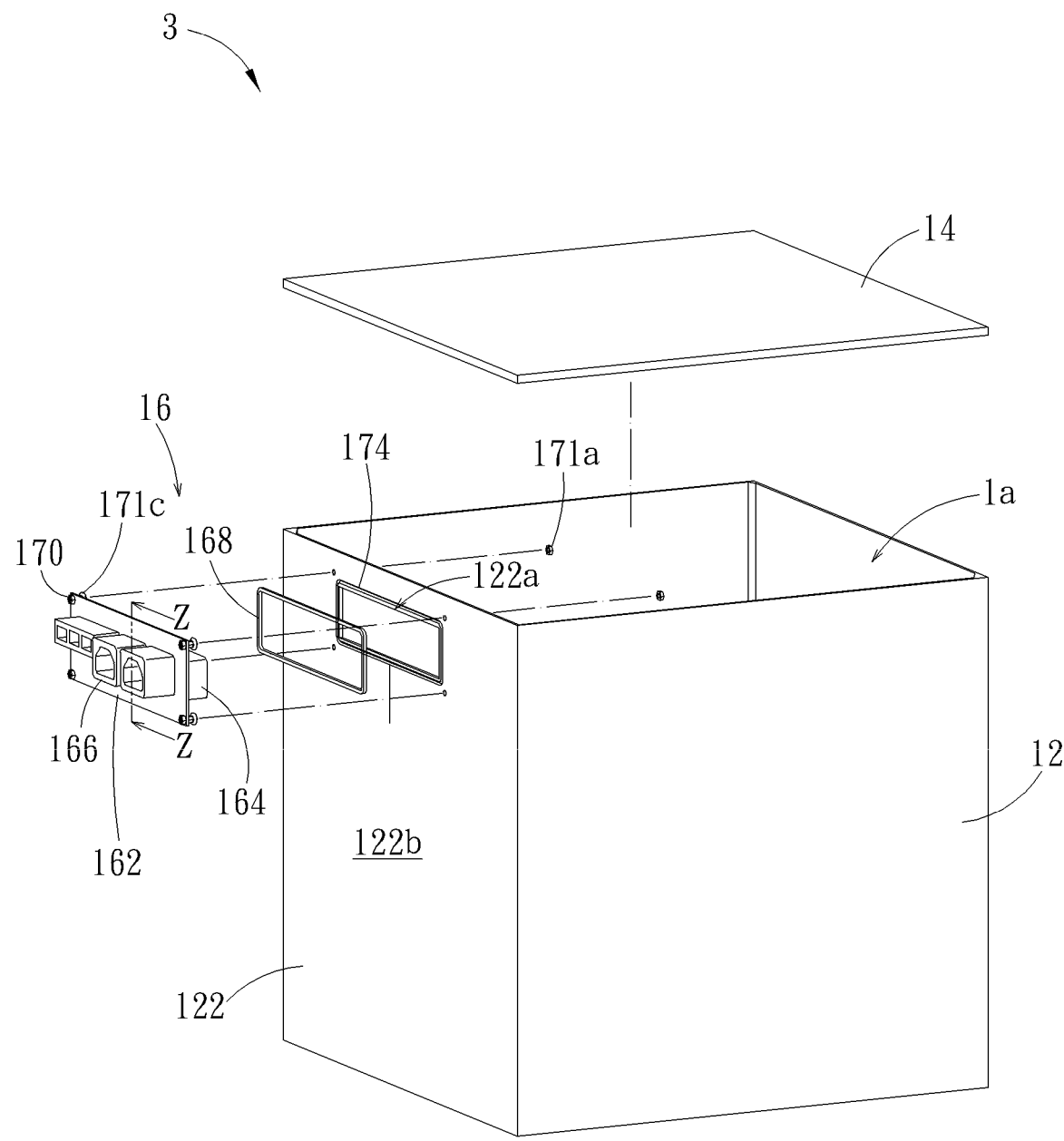
FIG. 6 is an exploded view of a container according to another embodiment.
Figure 7:
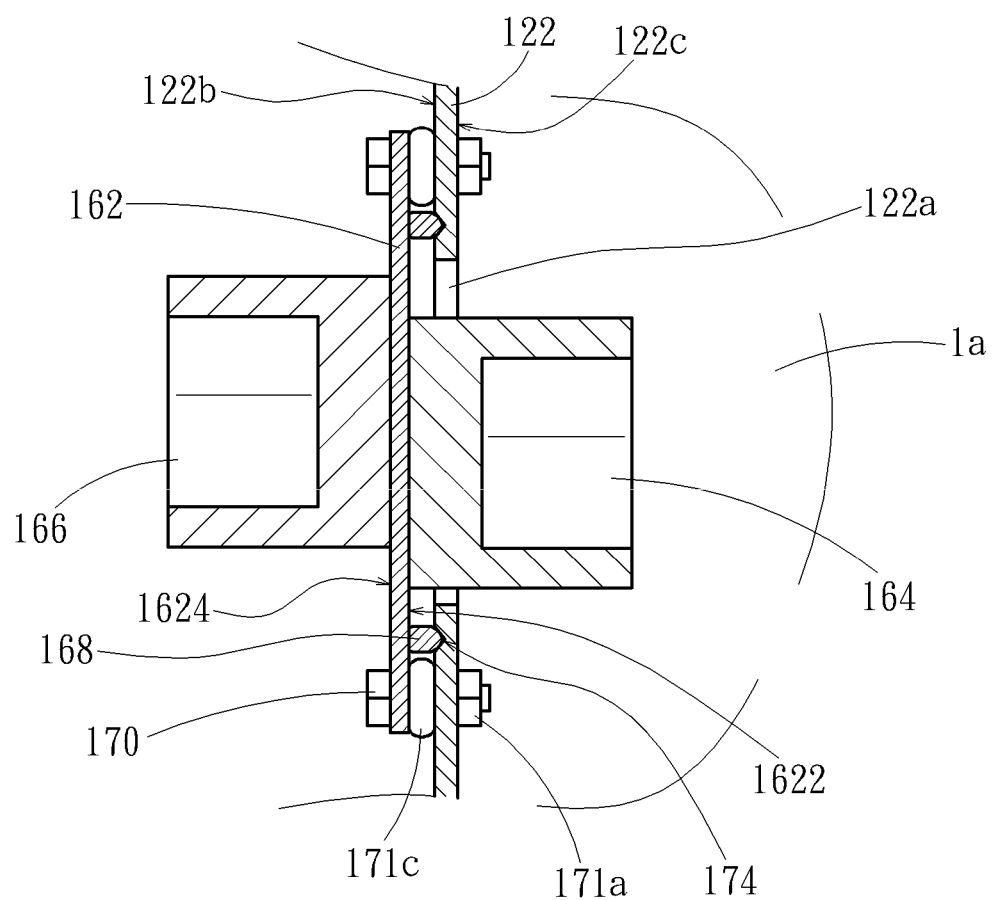
FIG. 7 is a sectional view of a portion of the container along the line Z-Z in FIG. 6.

Please refer to FIG. 6 and FIG. 7, which show a container 3 according to another embodiment. The container 3 is substantially similar in structure to the container 1, and uses the reference numbers of the container 1 in principle. For other descriptions about the container 3, please refer to the descriptions of the container 1 and the variants thereof in the foregoing, which will not be described in addition. Compared with the container 1, the adapter module 36 of the container 3 further includes an annular recess 174 disposed on the outer wall surface 122b of the container sidewall 122 corresponding to the sealing ring 168. The profiles of the annular recess 174 and the sealing ring 168 are the same. The sealing ring 168 is partially accommodated in the annular recess 174, so as to enhance the sealing of the circuit board 162 to the opening 122a. In the embodiment, the annular recess 174 and the container sidewall 122 are formed in a single part (e.g. the container sidewall 122 is made of thermal plastic material, or is formed by secondary machining); however, it is not limited thereto in practice. For example, the annular recess 174 is formed by another part adhering to the outer wall surface 122b. The sectional profile of the annular recess 174 is a reverse triangle, so the sides of the reverse triangle can increase the area of the annular recess 174 contacting the sealing ring 168 and enhance the stability of the contact. Both can enhance the sealing of the circuit board 162 to the opening 122a. In addition, in practice, it is practicable to dispose the annular recess 174 on the first surface 1622 of the circuit board 162, which also can enhance the sealing of the circuit board 162 to the opening 122a and will not be described in addition.

Figure 8:
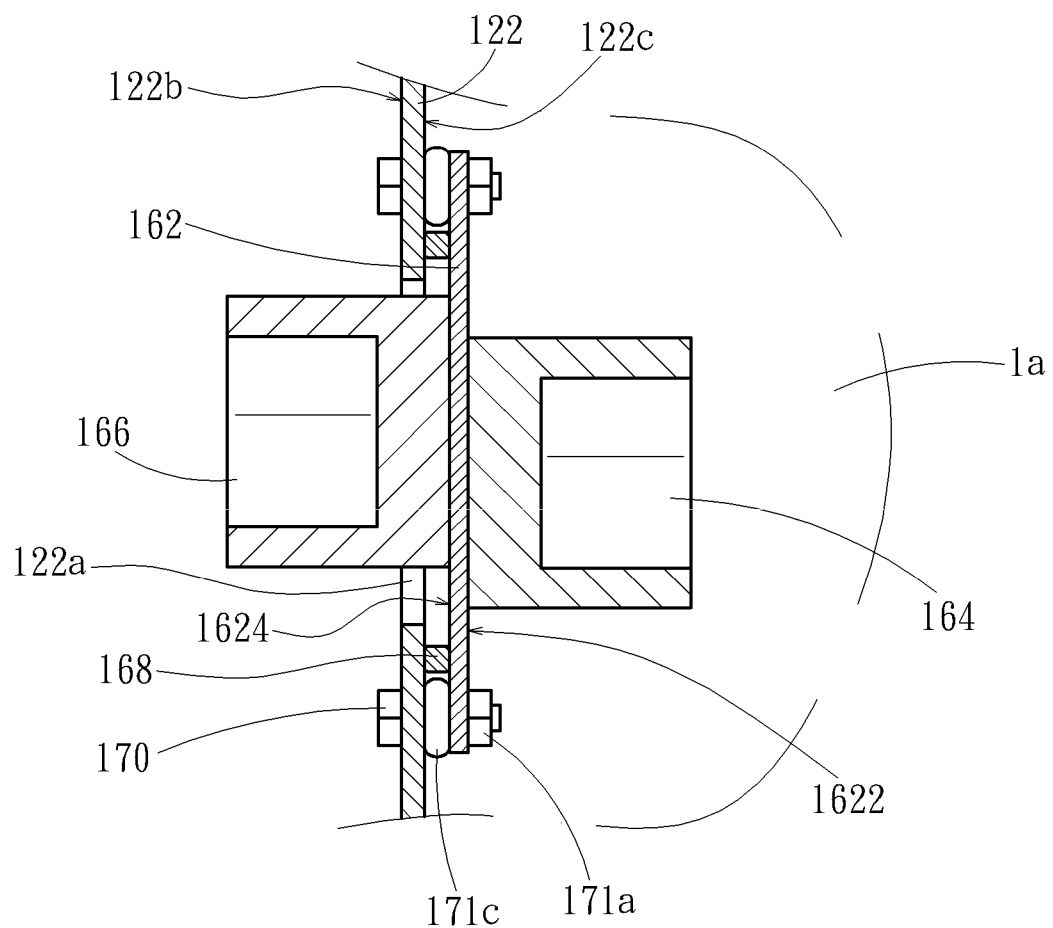
FIG. 8 is a sectional view of the container in FIG. 3 in another configuration according to another embodiment.

In the above embodiments, the circuit board 162 is located outside the main body 12 in the containers 1, 2 and 3. The first surface 1622 of the circuit board 162 is opposite to the outer wall surface 122b of the container sidewall 122. However, it is not limited thereto in practice. Please refer to FIG. 8. The circuit board 162 is changed to be disposed inside the main body 12. The circuit board 162 also can be fixed to the container sidewall 122. Therein, the second surface 1624 of the circuit board 162 is opposite to the inner wall surface 122c of the container sidewall 122. For other descriptions about the structural configuration shown as FIG. 8, please refer to the descriptions of the containers 1, 2 and 3 and the variants thereof in the foregoing, which will not be described in addition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An adapter module, disposed on a container sidewall of a container for an immersion cooling system, the container sidewall having an opening, the adapter module comprising:
   a circuit board, the circuit board having a first surface and a second surface opposite to the first surface;
   an inner connector, the inner connector being fixed on the first surface;
   an outer connector, the outer connector being fixed on the second surface and being electrically connected to the inner connector through the circuit board; and
   a sealing ring, disposed on the first surface and enclosing the inner connector;
   wherein the adapter module is fixed to the container sidewall and seals the opening through the circuit board, so that the first surface is opposite to an outer wall surface of the container sidewall, the sealing ring is clamped by and between the first surface and the outer wall surface of the container sidewall, and the inner connector is located in an accommodating space of the container and the outer connector is exposed out of the container.

2. The adapter module according to claim 1, wherein the inner connector is fixed on the first surface by a surface mount technology.

3. The adapter module according to claim 2, wherein the outer connector is fixed on the first surface by a surface mount technology.

4. The adapter module according to claim 1, further comprising an annular protrusion that is formed on the first surface or the outer wall surface of the container sidewall and abuts against the sealing ring.

5. The adapter module according to claim 1, further comprising an annular recess that is formed on the first surface or the outer wall surface of the container sidewall, wherein the sealing ring is partially accommodated in the annular recess.

6. The adapter module according to claim 1, further comprising a plurality of fixing parts that are located at an outside of the sealing ring, wherein the circuit board is fixed to the container sidewall through the fixing parts.

* * * * *